(12) United States Patent
Huang et al.

(10) Patent No.: US 7,199,397 B2
(45) Date of Patent: Apr. 3, 2007

(54) AMOLED CIRCUIT LAYOUT

(75) Inventors: Wei-Pang Huang, Hsinchu (TW); Li-Wei Shih, Minsyong Township, Chiayi County (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 10/839,624

(22) Filed: May 5, 2004

(65) Prior Publication Data

US 2005/0247932 A1 Nov. 10, 2005

(51) Int. Cl.
*H01L 29/04* (2006.01)
(52) U.S. Cl. .............................. 257/59; 257/72; 349/42; 349/43; 345/76
(58) Field of Classification Search ................. 257/72, 257/51–52; 349/43
See application file for complete search history.

(56) References Cited

U.S. PATENT DOCUMENTS

| | | | |
|---|---|---|---|
| 5,760,852 A | 6/1998 | Wu et al. ....................... 349/14 |
| 6,197,624 B1 | 3/2001 | Yamazaki ..................... 438/158 |
| 6,236,064 B1 | 5/2001 | Mase et al. .................... 257/72 |
| 6,265,290 B1 * | 7/2001 | Moon et al. .................. 438/505 |
| 6,326,286 B1 * | 12/2001 | Park et al. .................... 438/478 |
| 6,392,810 B1 | 5/2002 | Tanaka ......................... 359/622 |
| 6,469,318 B2 * | 10/2002 | Yamada et al. ................ 257/59 |
| 6,486,606 B1 | 11/2002 | Ting .......................... 315/169.1 |
| 6,524,877 B1 | 2/2003 | Nakazawa et al. ............ 438/48 |
| 6,538,632 B1 * | 3/2003 | Yamazaki et al. ............ 345/98 |
| 6,555,420 B1 | 4/2003 | Yamazaki .................... 438/158 |
| 6,555,422 B1 | 4/2003 | Yamazaki et al. .......... 438/166 |
| 6,781,153 B2 * | 8/2004 | Anzai .......................... 257/59 |
| 7,102,293 B2 * | 9/2006 | Matsumoto ............... 315/169.3 |
| 2002/0097350 A1 | 7/2002 | Haven et al. ................. 349/43 |
| 2002/0179904 A1 * | 12/2002 | Zhou et al. ................... 257/48 |
| 2002/0195968 A1 | 12/2002 | Sanford et al. .......... 315/169.3 |
| 2003/0052614 A1 | 3/2003 | Howard .................... 315/169.1 |
| 2003/0058203 A1 | 3/2003 | Ahn et al. .................... 345/82 |
| 2003/0076048 A1 | 4/2003 | Rutherford ............... 315/169.3 |
| 2003/0147019 A1 * | 8/2003 | Sasaki .......................... 349/43 |
| 2003/0155612 A1 * | 8/2003 | Kawachi et al. ............ 257/344 |
| 2003/0155860 A1 * | 8/2003 | Choi et al. .................. 313/498 |
| 2003/0230750 A1 * | 12/2003 | Koyama et al. .............. 257/72 |
| 2004/0201019 A1 * | 10/2004 | Kim et al. .................... 257/59 |

FOREIGN PATENT DOCUMENTS

| | | | |
|---|---|---|---|
| EP | 717446 | * | 6/1996 |
| JP | 6-57610 | * | 4/1985 |
| TW | 523930 | | 3/2003 |

* cited by examiner

*Primary Examiner*—Leonardo Andujar
*Assistant Examiner*—Ahmed N. Sefer
(74) *Attorney, Agent, or Firm*—Duane Morris LLP

(57) ABSTRACT

In an active matrix organic light emitting diode (AMOLED) display panel having an improved OLED circuit layout in the TFT back panel, the AMOLED pixels in the AMOLED pixel array are arranged to have the TFT circuit portions of the AMOLED pixels in clustered regions so that each pulse of laser beam during laser annealing of the amorphous silicon film irradiates mostly TFT circuit portions, thus, allowing more efficient laser annealing process.

10 Claims, 5 Drawing Sheets

AMOLED CIRCUIT LAYOUT

FIELD OF THE INVENTION

The present invention relates to an active matrix organic light emitting diode (AMOLED) display panel, and more particularly, to an improved layout of thin film transistor (TFT) circuits on the TFT back panel.

BACKGROUND

In a typical AMOLED display panel, the TFT device circuits are formed on a TFT back panel of the display panel. The TFT devices, which generally include a polycrystalline silicon film as a semiconductor layer, may be a bottom gate type or a top gate type, such as low temperature polysilicon thin film transistor. The polycrystalline silicon film requires high electron mobility in order for the TFT device to function optimally. In general, the polycrystalline silicon film is formed from an amorphous silicon film. One way to form the polycrystalline silicon film from the amorphous silicon film is to crystallize the amorphous silicon film by irradiating it with laser light, such as a high-power excimer laser. An excimer laser is a pulsed laser having KrF, ArF, or XeCl as a light source. The amorphous silicon film is generally crystallized over its entire surface by irradiating the substrate from one end to the other with excimer laser light that has been processed to have a linear shape. The linear shaped laser beam generally spans a portion or the whole length of a TFT back panel and is scanned in a lateral direction.

Illustrated in FIG. 1 is a 4×4 pixel array portion of a conventional AMOLED's TFT back panel 100. As illustrated, pixel region 110 comprises a TFT circuit portion 112 and an OLED circuit portion 114. The amorphous silicon film layer is initially deposited over the entire TFT back panel 100 and crystallized into polycrystalline form using the excimer laser annealing process. A linear-shaped excimer laser beam 120 is scanned over the entire surface of the TFT back panel 100 by irradiating a portion of the TFT back panel 100 at a time. Since the size of the laser beam is limited, many pulses of laser beams are required to cover the entire TFT back panel 100.

After the amorphous silicon film is laser annealed into polycrystalline film, subsequent photolithographic process steps remove unnecessary portions of the polycrystalline film except for the polycrystalline islands that are required for the source, drain and channel regions of the TFT devices in the TFT circuit portion 112. But, as illustrated in FIG. 1, the width $W_L$ of the laser beam 120 is wider than the TFT circuit portion 112 and irradiates more than just the TFT circuit portion 112 of the amorphous silicon film covering the TFT back panel 100. For example, the width $W_L$ of excimer laser beam 120 commonly used in this application is about 400 micrometers, whereas, the width of the TFT circuit portion 112 is about 100 micrometers. Thus, the laser annealing process crystallizes the amorphous silicon film covering the OLED circuit portion 110 of the TFT back panel 100 as well. Although the polycrystalline silicon film is subsequently removed from the OLED portion 110, this often results in undesirable line mura defects in the finished AMOLED display panel.

Mura defects are defects that exhibit as non-uniform contrast regions on an LCD or an OLED display panel and are attributed to pulse-to-pulse variations in the laser beam energy that is used to crystallize the amorphous silicon film. These defects are more pronounced when a constant gray value image or pattern is displayed. In AMOLED display panels, the laser anneal irradiation of the non-TFT regions, such as the OLED circuit portion 110, on the TFT back panel often results in line-shaped mura defects. The non-uniform laser beam energy caused by pulse-to-pulse variations in the laser beam energy results in non-uniform performance of polycrystalline silicon. And because the TFT characteristic is sensitive to the performance of the polycrystalline silicon and the TFT devices drive the OLED devices, the non-uniform TFT characteristics result in non-uniformity in OLED's brightness. This non-uniformity causes the line mura defects.

To eliminate the line mura defect problem, conventional laser annealing process for crystallizing the amorphous silicon film calls for overlapping each pulse of the laser beam to minimize the effects of the pulse-to-pulse variations in the laser beam energy. Furthermore, the silicon film is scanned with the laser beam twice to further minimize the effects of the pulse-to-pulse variations in the laser beam energy. But these conventional solutions are expensive because the processing time is increased and the life of the laser is shortened because of the increased duty cycle.

Also, because substantial portion of the laser beam energy is spent in irradiating unnecessary portions of the amorphous silicon thin film areas, the conventional AMOLED circuit layout results in an inefficient use of manufacturing resources. And the unnecessary expenditure of the laser beam energy attributes to unnecessarily shortening the life of the excimer laser tool.

SUMMARY

According to an aspect of the present invention, an improved active matrix organic light emitting diode (AMOLED) circuit layout for a thin film transistor back panel that addresses the problems associated with the conventional AMOLED display panel is disclosed.

According to an aspect of the present invention, an improved AMOLED display panel comprises a TFT back panel and an array of AMOLED pixels on the TFT back panel. Each of the AMOLED pixels has a TFT circuit portion and an OLED circuit portion. The TFT circuit portion comprises at least one layer of polycrystalline silicon film formed by laser annealing an amorphous silicon film. The array of AMOLED pixels are arranged to have the TFT circuit portions of the AMOLED pixels in clustered regions wherein each of the clustered regions of the AMOLED pixels constitute substantially the area irradiated by a pulse of laser beam during the laser annealing of the amorphous silicon film. This allows the laser beam to irradiate mostly the amorphous silicon film in the TFT circuit portions rather than any of the amorphous silicon film in the OLED circuit portions which do not require laser annealing. Thus, the improved AMOLED circuit layout allows more efficient use of the laser.

The TFT circuit portion may comprise at least one TFT device and the polycrystalline silicon film forms source, drain and channel regions of the at least one low temperature polysilicon thin film transistor device.

According to another aspect of the present invention, an improved AMOLED display panel comprises a TFT back panel and an array of AMOLED pixels on the TFT back panel. One of the AMOLED pixels has a TFT circuit portion and an OLED circuit portion, and the TFT circuit portion comprises at least one layer of polycrystalline silicon film formed by laser annealing a layer of amorphous silicon film. The array of AMOLED pixels comprises at least one pair of columns of the AMOLED pixels and the AMOLED pixels are arranged to have the TFT circuit portions of the AMOLED pixels in one column opposing the TFT circuit portions of the AMOLED pixels in the other column. This arrangement of the AMOLED pixel circuits allow the TFT circuit portions from both columns to be irradiated at the same time with a single pulse of laser beam during the laser annealing process. By arranging the TFT circuit regions into clustered regions formed by columns of the AMOLED pixels in this manner, the overall laser annealing process time may be reduced because unlike in the case of laser annealing the conventional TFT back panel, any time and laser resources spent in irradiating the unnecessary OLED circuit portions.

Again, the TFT circuit portion may comprise at least one TFT device and the polycrystalline silicon film forms source, drain and channel regions of the at least one low temperature polysilicon thin film transistor device.

BRIEF DESCRIPTION OF THE DRAWINGS

The features shown in the above-referenced drawings are schematic only and are not drawn to scale. Like reference numbers represent like elements.

DETAILED DESCRIPTION

Figure 2:
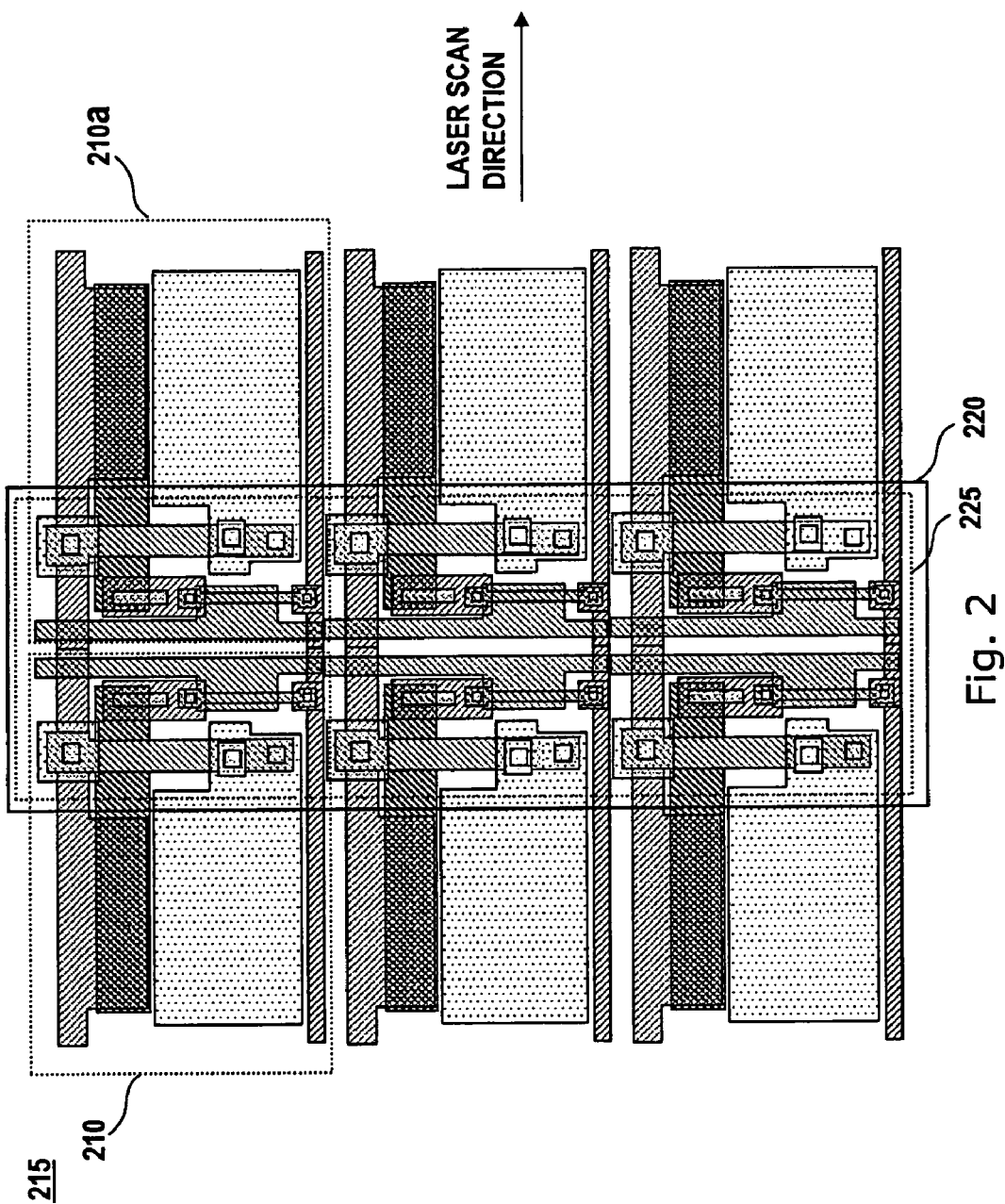
FIG. 2 is a schematic plan view illustration of the AMOLED circuit layout according to an aspect of the present invention.
Figure 3A:
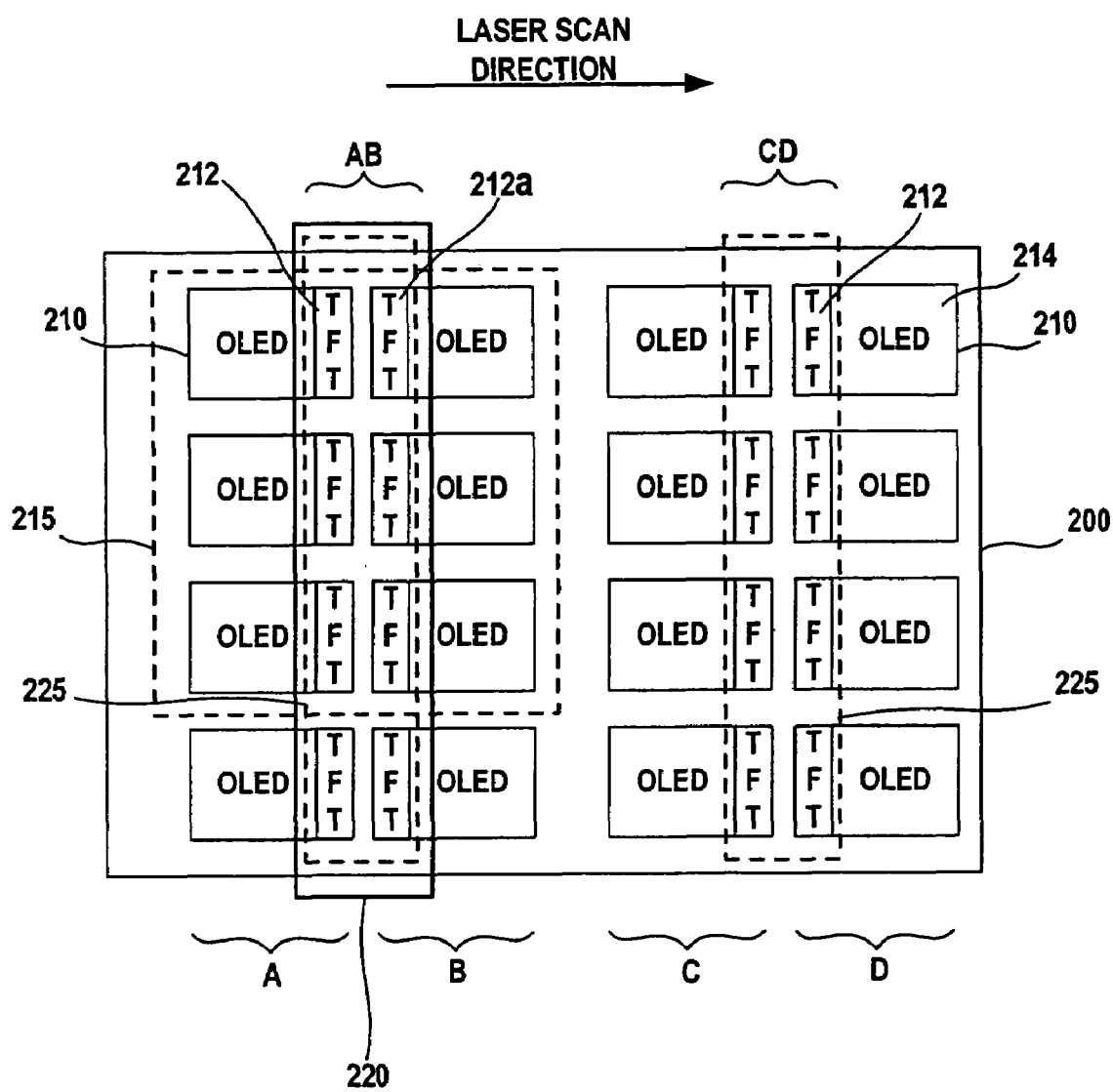
FIG. 3a is a schematic illustration of a TFT back panel of an AMOLED display panel having the AMOLED circuit layout of FIG. 2.

Referring to FIGS. 2 and 3a, an example of an AMOLED's TFT back panel 200 having an improved AMOLED circuit layout according to an aspect of the present invention is disclosed. As shown in FIG. 3a, the AMOLED circuits on the improved TFT back panel 200 are arranged so that the TFT circuit portions 212 of the AMOLED pixels 210 are in clustered regions 225 that fit substantially within an area covered by a linear-shaped excimer laser beam 220. In this example, the TFT circuit portions 212 of two neighboring AMOLED pixels 210 are oriented toward one another. As shown, the TFT circuit portions 212 of the AMOLED pixels 210 in the first pixel column A of the TFT back panel 200 are located on the right side of the AMOLED pixels 210 while the TFT circuit portions 212a of the AMOLED pixels 210 in the second pixel column B are located on the left side of the AMOLED pixels 210. Same arrangement of the TFT circuit portions is repeated for the third and the fourth pixel columns C and D.

Figure 1:
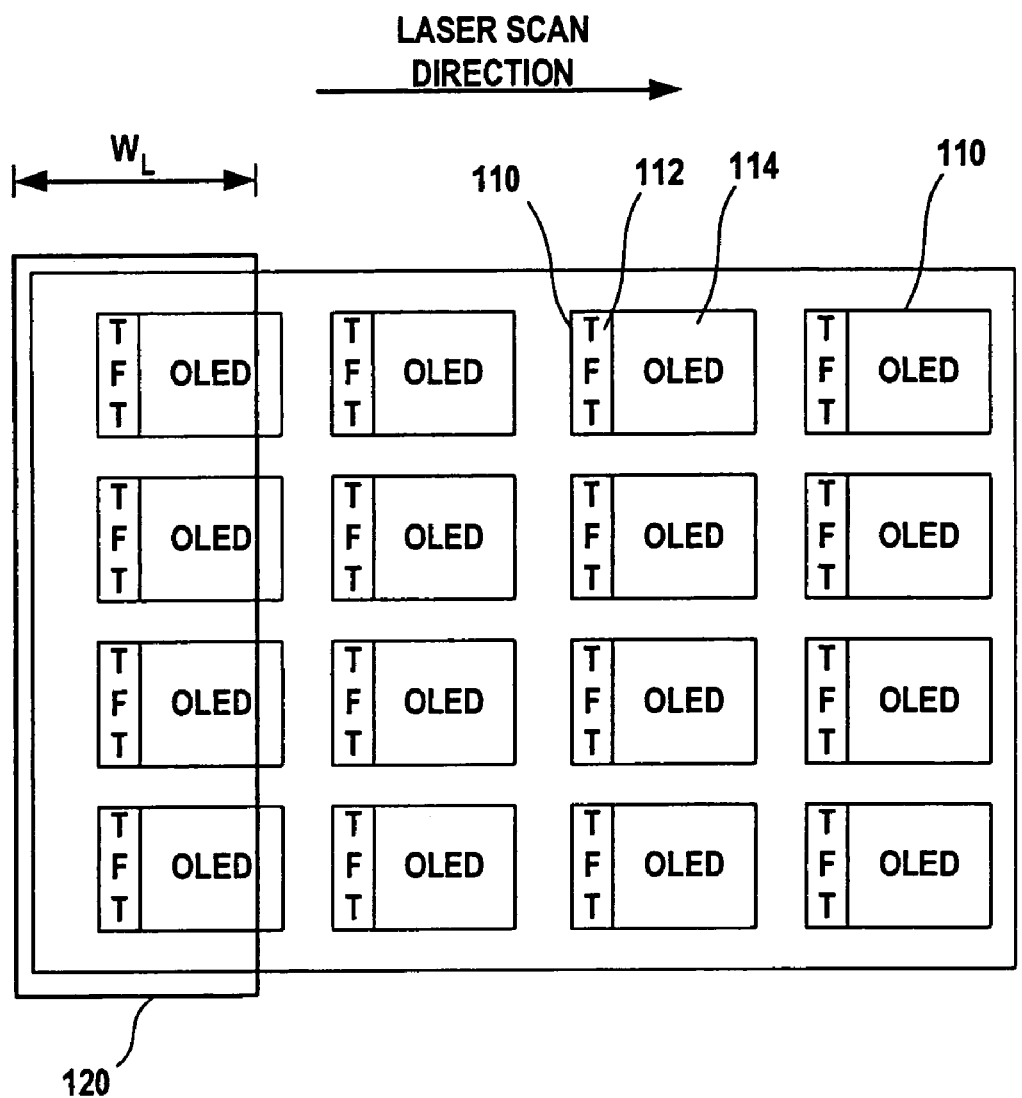
FIG. 1 is a schematic illustration of AMOLED circuit layout on a TFT back panel of a conventional AMOLED display panel.

This innovative arrangement of the TFT circuit portions 212 of the AMOLED pixels 210, where the TFT circuit portions 212 of two adjacent columns of the AMOLED pixels 210 are facing each other, allows the linear-shaped excimer laser beam 220 to capture the TFT circuit portions 212 of two adjacent columns in one irradiation. The TFT circuit portion 212 occupies a substantial area irradiated by the excimer laser beam 220. Thus, unlike the conventional AMOLED TFT back panel 100 of FIG. 1, the energy of the laser beam 220 is more efficiently utilized for irradiating the desired TFT circuit portions 212 rather than being wasted on the OLED circuit portions 214.

In addition to each irradiating shot of the laser beam 220 being more efficiently utilized, because the TFT circuit portions 212 are clustered together between adjacent pairs of columns of the AMOLED pixel 210, the overall laser annealing process may be more efficiently conducted in the improved AMOLED TFT back panel 200. To crystallize the amorphous silicon film in the TFT circuit portion 212 of the improved AMOLED TFT back panel 200, the laser beam 220 may irradiate the first pair of columns AB of the TFT circuit portions and then skip over to the second pair of columns CD of the TFT circuit portions. No time is spent irradiating the OLED circuit portions 214 of the TFT back panel 200. Because the TFT circuits are arranged more efficiently, allowing only the amorphous silicon film in the TFT circuit portions to be laser annealed, the overall laser annealing process time is substantially reduced.

The 4×4 array OLED pixel layout of the TFT back panel 200 illustrated in FIG. 3a is only an exemplary illustration only and the present invention is equally applicable to TFT back panels having different number of columns and rows of OLED pixels.

Figure 3B:
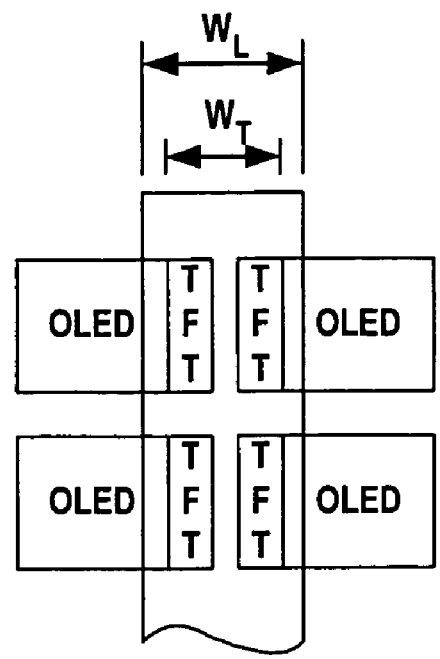
FIGS. 3b and 3c are schematic illustrations of a portion of a TFT back panel of an AMOLED display panel according to various embodiments of the present invention.

Referring to FIG. 3b, according to an embodiment of the present invention, the width $W_T$ of the TFT circuit portions AB or CD may be substantially equal to the width $W_L$ of the laser beam. Then, one of the TFT circuit portions AB or CD may be irradiated with a single laser beam to crystallize the amorphous silicon film in those regions. Further, in order to minimize the pulse-to-pulse laser beam energy variations, one of the TFT circuit portions AB or CD may be irradiated with additional pulses of the laser beams as necessary.

Figure 3C:
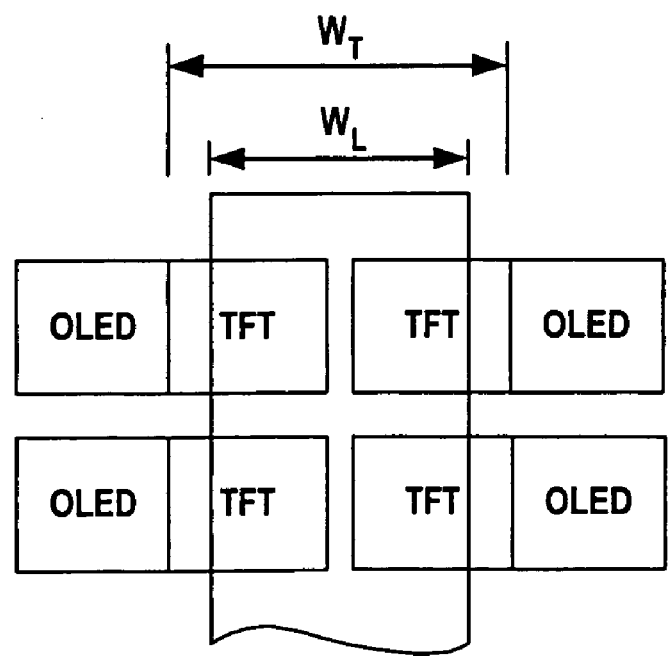

Referring to FIG. 3c, according to another embodiment of the present invention, the width $W_T$ of the TFT circuit portions AB or CD may be larger than the width $W_L$ of a laser beam, the laser beam may scan across the width $W_T$ of one of TFT circuit portions AB or CD within the TFT circuit portions AB or CD. Each subsequent pulse of the laser beam may be overlapped as the laser beam scans across the width of one of the TFT circuit portions AB or CD. When the laser scanning of the first TFT circuit portion AB is completed, the laser is skipped over to the next TFT circuit portion CD without irradiating the unnecessary OLED portions in between the regions AB and CD. If necessary, one of the TFT circuit portions AB or CD may be scanned twice in order to minimize the pulse-to-pulse variations in the laser beam energy.

Figure 4:
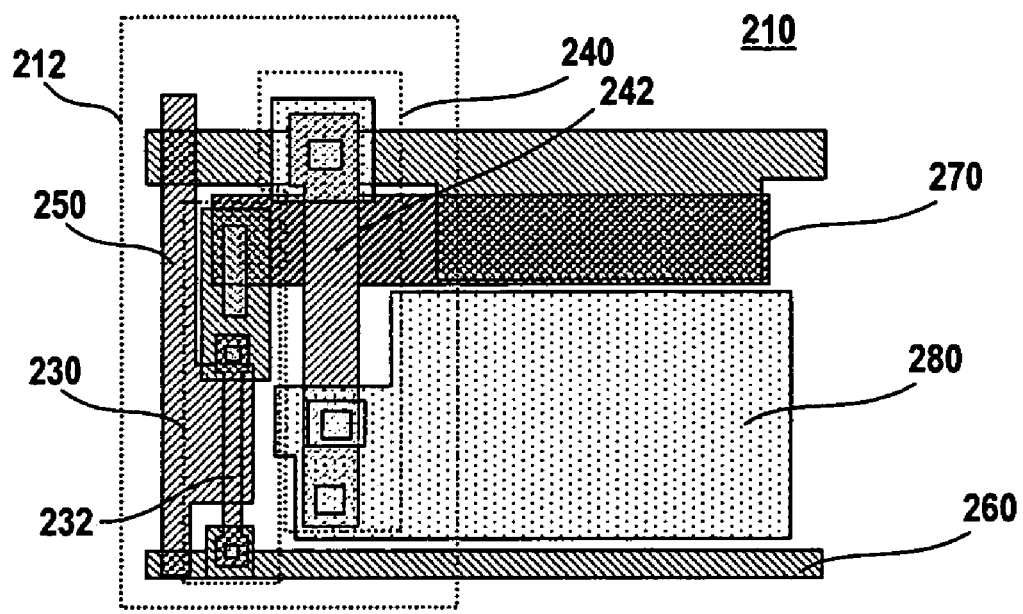
FIG. 4 is a schematic plan view illustration of a pixel region of a typical AMOLED panel.
Figure 5:
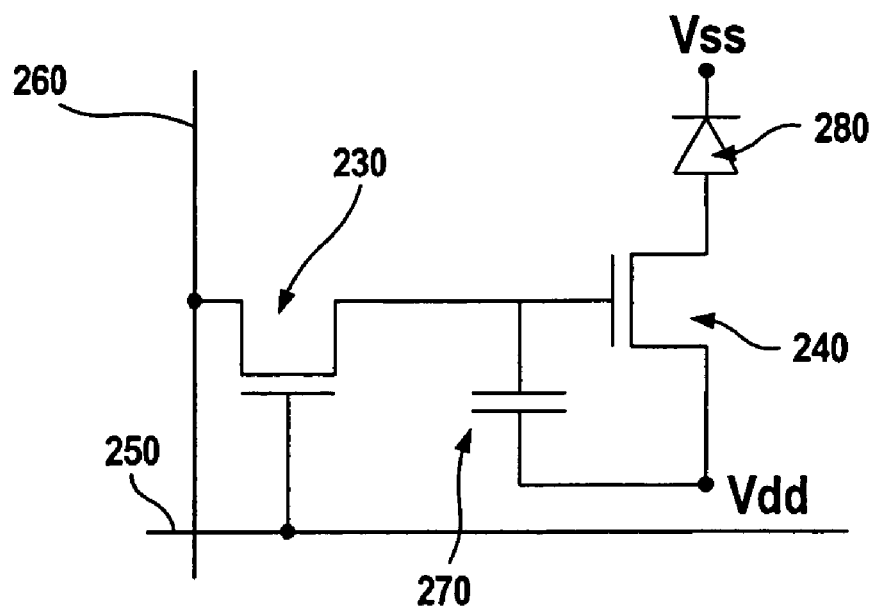
FIG. 5 is a schematic circuit diagram of a pixel of a typical AMOLED panel.

Detailed illustrations of a pixel 210 are shown in FIGS. 4 and 5. FIG. 4 is an illustration of a plan view illustration of a pixel 210 showing the detailed structures of the TFT circuit portion 212. In this example, the OLED pixel includes top-gate type TFTs 230 and 240, a capacitor 270 and an OLED 280. The channel regions 232 and 242 of the TFTs 230 and 240 respectively are formed from the polycrystalline silicon film that was crystallized from amorphous silicon film via the excimer laser annealing process. Referring to the circuit diagram of the AMOLED pixel 210 illustrated in FIG. 5. A high voltage level on a gate line (scan line) 250 turns the TFT 230 ON, thus providing a voltage from a data line 260 to the capacitor 270. After a period of time, the gate voltage of the TFT 240 is the same as the voltage on data line 260, and voltage on gate line 250 is set low. The TFT 240 operates as a voltage follower to drive the OLED 280. Current through the OLED 280 is sourced from a supply voltage Vdd and returned to a supply voltage Vss. As the OLED 280 is driven, a threshold voltage of the TFT 240 changes with time.

While the foregoing invention has been described with reference to the above embodiments, various modifications and changes can be made without departing from the spirit of the invention.

What is claimed is:

1. An active matrix organic light emitting diode (AMOLED) display panel comprising:
   a thin film transistor (TFT) back panel; and
   an array of AMOLED pixels on the TFT back panel, at least one of the AMOLED pixels having a TFT circuit portion and an OLED circuit portion, at least one of the TFT circuit portions comprising at least one layer of polycrystalline silicon film formed by laser annealing an amorphous silicon film, and the array of AMOLED pixels are arranged to have the TFT circuit portions of the AMOLED pixels positioned in clustered regions, said clustered regions being defined by at least one pair of adjacent rows or columns of AMOLED pixels oriented toward one another so that between said pair of adjacent rows or columns of AMOLED pixels, the respective TFT circuit portions of two immediately adjacent ones of the AMOLED pixels are side by side, wherein each of the clustered regions constitutes substantially the area irradiated by a pulse of laser beam during the laser annealing of the amorphous silicon film allowing the laser beam to irradiate mostly the TFT circuit portions rather than the OLED circuit portions.

2. The AMOLED display panel of claim 1, wherein the laser annealing is conducted with an excimer laser.

3. The AMOLED display panel of claim 1, wherein at least one of the TFT circuit portions comprises at least one TFT device and the polycrystalline silicon portion forms source, drain and channel regions of the at least one TFT device.

4. The AMOLED display panel of claim 3, wherein the TFT device is a low temperature polysilicon thin film transistor.

5. The AMOLED display panel of claim 1, wherein said laser beam has a width and the TFT circuit portions have a width that is substantially equal to or larger than the width of the laser beam.

6. The AMOLED display panel of claim 1, wherein at least one of the TFT circuit portions comprises first and second top-gate type TFTs and a capacitor, wherein one source/drain region of the first top-gate type TFT is coupled to a gate of the second top-gate type TFTs, and the capacitor is coupled to the source/drain region of the first top-gate type TFT, the gate of the second top-gate type TFTs and one source/drain region of the second top-gate TFT.

7. The AMOLED display panel of claim 6, wherein the top-gate type TFTs comprise channel regions formed from the polycrystalline silicon film formed by laser annealing the amorphous silicon film.

8. The AMOLED display panel of claim 6, wherein a gate of the first top-gate type TFT is coupled to a scan line, and another source/drain region of the first top-gate type TFT is coupled to a data line.

9. The AMOLED display panel of claim 6, wherein another source/drain region of the second top-gate TFT is coupled to the OLED circuit portion.

10. The AMOLED display panel of claim 9, wherein the one source/drain region of the second top-gate TFT is coupled to a supply voltage Vdd, and the another source/drain region of the second top-gate TFT is coupled to a supply voltage Vss.

* * * * *